US012604633B2

(12) United States Patent
Kim et al.

(10) Patent No.: US 12,604,633 B2
(45) Date of Patent: Apr. 14, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Sujeong Kim, Yongin-si (KR); Jina Seo, Yongin-si (KR); Seokgyu Yoon, Yongin-si (KR); Yunho Lee, Yongin-si (KR); Jinsoo Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 394 days.

(21) Appl. No.: 18/191,258

(22) Filed: Mar. 28, 2023

(65) Prior Publication Data

US 2024/0074276 A1     Feb. 29, 2024

(30) Foreign Application Priority Data

Aug. 23, 2022     (KR) ......................... 10-2022-0105770

(51) Int. Cl.
| | |
|---|---|
| *H10K 59/38* | (2023.01) |
| *H10K 59/60* | (2023.01) |
| *H10K 59/80* | (2023.01) |
| *H10K 71/00* | (2023.01) |

(52) U.S. Cl.
CPC ............. *H10K 59/38* (2023.02); *H10K 59/60* (2023.02); *H10K 59/8792* (2023.02); *H10K 71/00* (2023.02)

(58) Field of Classification Search
CPC .... H10K 59/60; H10K 59/38; H10K 59/8792; H10K 65/00; H10K 39/32; H10K 59/13; H10K 39/38; G06V 40/13; G06V 40/1318
See application file for complete search history.

(56) References Cited

U.S. PATENT DOCUMENTS

| | | |
|---|---|---|
| 8,902,431 B2 | 12/2014 | Liesener et al. |
| 8,943,580 B2 | 1/2015 | Fadell et al. |
| 9,465,477 B2 | 10/2016 | Rosenberg et al. |
| 9,710,689 B2 | 7/2017 | Evans et al. |
| 10,198,611 B2 | 2/2019 | Evans et al. |
| 11,016,328 B2 | 5/2021 | Kim et al. |
| 11,049,901 B2 | 6/2021 | Ryu et al. |
| 11,355,577 B2 | 6/2022 | Watanabe et al. |
| 2014/0168584 A1* | 6/2014 | Lee ................... G02F 1/133512 |
| | | 349/106 |

(Continued)

FOREIGN PATENT DOCUMENTS

| | | |
|---|---|---|
| CN | 114721182 A | 7/2022 |
| KR | 10-1191842 | 10/2012 |

(Continued)

*Primary Examiner* — Alia Sabur
(74) *Attorney, Agent, or Firm* — F. CHAU & ASSOCIATES, LLC

(57) ABSTRACT

A display apparatus includes a substrate. A light-emitting element is disposed on the substrate. The light-emitting element emits light. A photodetector is disposed on the substrate. The photodetector detects light. A light-blocking layer includes a first hole and a second hole. The first hole is disposed above the light-emitting element. The second hole is disposed above the photodetector. A first color filter is disposed to cover the first hole. A second color filter is disposed to cover the second hole. A third color filter is arranged to overlap a portion of the second hole.

20 Claims, 15 Drawing Sheets

(56) References Cited

U.S. PATENT DOCUMENTS

| | | | | |
|---|---|---|---|---|
| 2018/0095195 A1* | 4/2018 | Kim | ........................ | H10K 59/38 |
| 2018/0182814 A1* | 6/2018 | Kim | .................. | H10K 59/8792 |
| 2021/0034832 A1 | 2/2021 | Lee et al. | | |
| 2021/0249478 A1* | 8/2021 | Oh | ......................... | H10K 59/38 |
| 2021/0305324 A1* | 9/2021 | Kawamura | .......... | H10K 59/879 |
| 2022/0067340 A1* | 3/2022 | Han | ........................ | G06F 3/042 |
| 2022/0246694 A1* | 8/2022 | Watanabe | ............ | H10K 59/352 |
| 2022/0328797 A1* | 10/2022 | Zeng | .................. | G06V 10/143 |
| 2023/0082085 A1* | 3/2023 | Xiao | ................... | H10K 59/122 |
| | | | | 257/91 |
| 2023/0117024 A1* | 4/2023 | Kubota | .................... | G09F 9/00 |
| | | | | 257/40 |
| 2023/0165120 A1* | 5/2023 | Li | ......................... | H10K 59/60 |
| | | | | 257/91 |
| 2024/0046693 A1* | 2/2024 | Long | ................. | G06V 40/1318 |
| 2024/0389441 A1* | 11/2024 | Kubota | ............... | H10K 59/126 |

FOREIGN PATENT DOCUMENTS

| | | |
|---|---|---|
| KR | 10-2015-0125207 A | 11/2015 |
| KR | 10-2020-0046817 | 5/2020 |
| KR | 10-2020-0059369 | 5/2020 |
| KR | 10-2021-0014249 | 2/2021 |
| KR | 10-2021-0027110 | 3/2021 |
| KR | 10-2022-0030004 A | 3/2022 |

* cited by examiner

DISPLAY APPARATUS AND METHOD OF MANUFACTURING THE SAME

CROSS-REFERENCE TO RELATED APPLICATION

This application claims priority under 35 USC. § 119 to Korean Patent Application No. 10-2022-0105770, filed on Aug. 23, 2022 in the Korean Intellectual Property Office, the disclosure of which is incorporated by reference in its entirety herein.

1. TECHNICAL FIELD

One or more embodiments of the present disclosure relate to an apparatus and a method, and more particularly, to a display apparatus and a method of manufacturing the display apparatus.

2. DISCUSSION OF RELATED ART

Mobile electronic apparatuses are widely used electronic devices. Examples of mobile electronic apparatuses that are widely used include tablet personal computers (PCs), as well as miniaturized electronic apparatuses such as mobile phones.

The mobile electronic apparatuses include a display apparatus to support various functions. For example, the display apparatus may provide a user of the mobile electronic apparatus with visual information, such as images. As the parts driving a display apparatus have been increasingly miniaturized, the proportion of the display apparatus in an electronic apparatus has gradually increased. Research is being conducted on a structure that may be bent to a preset angle with respect to a flat state.

SUMMARY

One or more embodiments include a display apparatus with an increased resolution, including a hole of a reduced size in a blocking layer disposed on a photodetector.

However, such a technical problem is an example, and embodiments of the present disclosure are not necessarily limited thereto.

Additional aspects will be set forth in part in the description which follows and, in part, will be apparent from the description, or may be learned by practice of the presented embodiments of the disclosure.

According to an embodiment of the present disclosure, a display apparatus includes a substrate. A light-emitting element is disposed on the substrate. The light-emitting element emits light. A photodetector is disposed on the substrate. The photodetector detects light. A light-blocking layer includes a first hole and a second hole. The first hole is disposed above the light-emitting element. The second hole is disposed above the photodetector. A first color filter is disposed to cover the first hole. A second color filter is disposed to cover the second hole. A third color filter is arranged to overlap a portion of the second hole.

In an embodiment, the third color filter may be a blue color filter transmitting blue light. The first color filter may be a green color filter transmitting green light, or a red color filter transmitting red light.

In an embodiment, the second color filter transmits light of a same color as a color of the first color filter.

In an embodiment, at least a portion of the third color filter may be disposed on the second color filter.

In an embodiment, the third color filter may be connected to a first surface of the second color filter that faces a direction that the light is emitted.

In an embodiment, at least a portion of the third color filter may be disposed under the second color filter.

In an embodiment, the third color filter may be connected to a first surface of the light-blocking layer that faces the substrate.

In an embodiment, at least a portion of the third color filter may be disposed between the light-blocking layer and the second color filter.

In an embodiment, the third color filter may be connected to a second surface of the light-blocking layer that forms an inner surface of the second hole.

In an embodiment, the third color filter may be connected to a third surface of the light-blocking layer that faces a direction that the light is emitted.

According to an embodiment of the present disclosure, a method of manufacturing a display apparatus includes disposing a light-emitting element on a substrate. The light-emitting element emits light. A photodetector is disposed on the substrate. The photodetector detects light. A light-blocking layer is disposed that includes a first hole and a second hole. The first hole is above the light-emitting element. The second hole is above the photodetector. A first color filter is disposed to cover the first hole. A second color filter is disposed to cover the second hole. A third color filter is disposed to overlap a portion of the second hole.

In an embodiment, the disposing of the third color filter may include, after the disposing of the second color filter, disposing at least a portion of the third color filter on the second color filter.

In an embodiment, the third color filter may be connected to a first surface of the second color filter that faces a direction that the light is emitted.

In an embodiment, the disposing of the light-blocking layer may include, after the disposing of the third color filter, disposing at least a portion of the light-blocking layer on the third color filter.

In an embodiment, the third color filter may be connected to a first surface of the light-blocking layer that faces the substrate.

In an embodiment, the disposing of the third color filter may include, after the disposing of the light-blocking layer, disposing the third color filter on the light-blocking layer, and the disposing of the second color filter may include, after the disposing of the third color filter, disposing at least a portion of the second color filter on the third color filter.

In an embodiment, the third color filter may be connected to a second surface of the light-blocking layer that forms an inner surface of the second hole.

In an embodiment, the third color filter may be connected to a third surface of the light-blocking layer that faces a direction that the light is emitted.

In an embodiment, the third color filter may be a blue color filter transmitting blue light, and the first color filter may be a green color filter transmitting green light, or a red color filter transmitting red light.

In an embodiment, the second color filter may transmit light of a same color as a color of the first color filter.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION OF EMBODIMENTS

Figure 1:
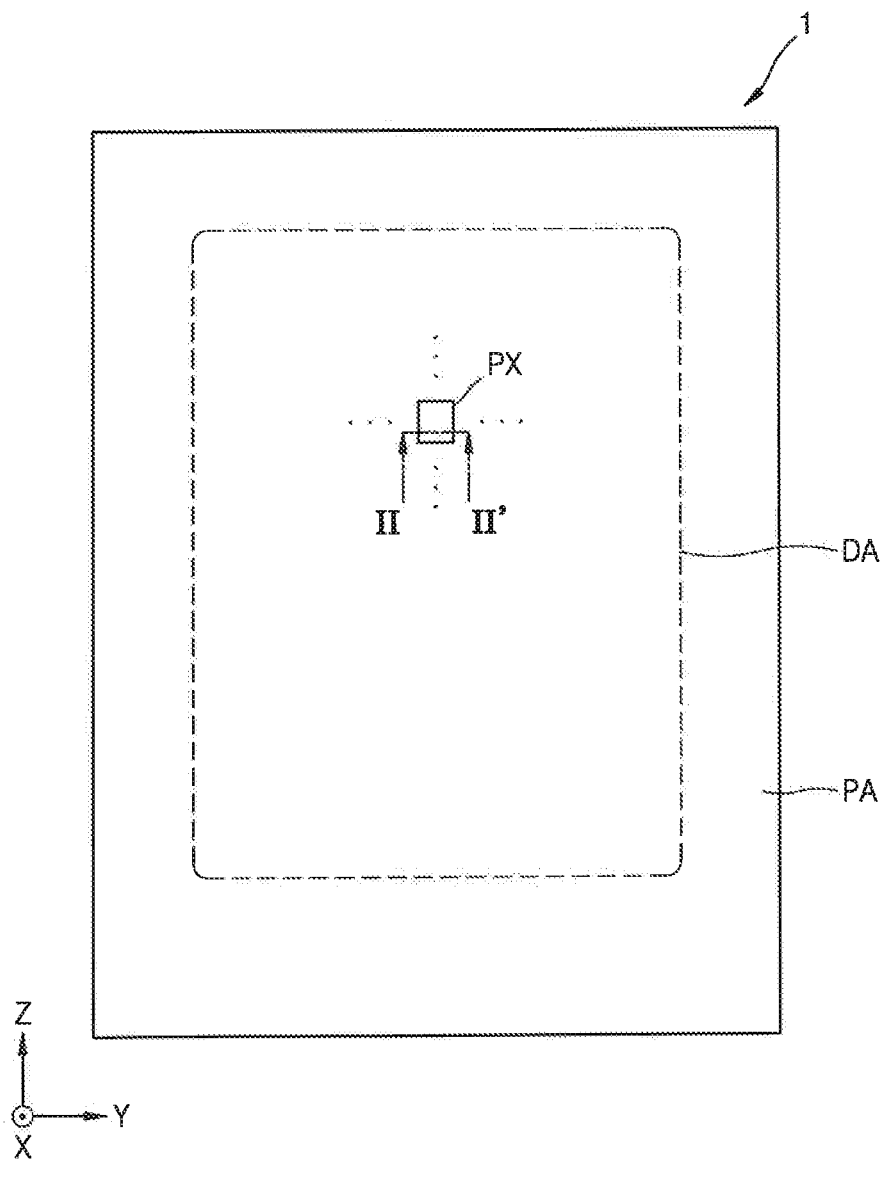
FIG. 1 is a schematic plan view of a display apparatus manufactured by a method of manufacturing a display apparatus according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, non-limiting embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the present disclosure, and methods for achieving them will be clarified with reference to embodiments described below in detail with reference to the drawings. However, the present disclosure is not limited to the following embodiments and may be embodied in various forms.

Hereinafter, embodiments of the present disclosure will be described with reference to the accompanying drawings, wherein like reference numerals refer to like elements throughout and a repeated description thereof is omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. For example, intervening layers, regions, or elements may be present. When a layer, region, or element is referred to as being "directly on" another layer, region, or element, no intervening layers, regions, or elements may be present.

Sizes of elements in the drawings may be exaggerated or reduced for convenience of explanation. As an example, the size and thickness of each element shown in the drawings may be arbitrarily represented for convenience of description, and thus, embodiments of the present disclosure are not necessarily limited thereto.

The x-axis, the y-axis and the z-axis are not necessarily limited to three axes of the rectangular coordinate system, and may be interpreted in a broader sense. For example, the x-axis, the y-axis, and the z-axis may be perpendicular to one another, or may represent different directions that are not perpendicular to one another.

In the case where a certain embodiment may be implemented differently, a specific process order may be performed in the order different from the described order. As an example, two processes successively described may be simultaneously performed substantially and performed in the opposite order.

FIG. 1 is a schematic plan view of a display apparatus 1 manufactured by a method of manufacturing a display apparatus according to an embodiment.

Referring to FIG. 1, the display apparatus 1 may include a display area DA and a peripheral area PA outside the display area DA. The display apparatus 1 may be configured to display images through an array of a plurality of pixels PX arranged two-dimensionally in the display area DA (e.g., in the Y and Z directions).

The peripheral area PA is a region that does not display images and may surround the display area DA entirely or partially. In an embodiment, a driver and the like configured to provide electric signals or power to pixel circuits respectively corresponding to the pixels PX may be arranged in the peripheral area PA. A pad may be arranged in the peripheral area PA. The pad is a region to which electronic elements or a printed circuit board may be electrically connected.

Hereinafter, the display apparatus 1 will be described as including an organic light-emitting diode OLED as a light-emitting diode for convenience of explanation. However, embodiments of the present disclosure are not necessarily limited thereto and the light-emitting element may be various other types known in the art. For example, in an embodiment, the display apparatus 1 may be a light-emitting display apparatus including an inorganic light-emitting diode, that is, an inorganic light-emitting display apparatus. The inorganic light-emitting diode may include a PN diode including inorganic material semiconductor-based materials. When a forward voltage is applied to a PN-junction diode, holes and electrons are injected and energy created by recombination of the holes and the electrons is converted to light energy, and thus, light of a preset color may be emitted. The inorganic light-emitting diode may have a width in the range of several micrometers to hundreds of micrometers. In an embodiment, the inorganic light-emitting diode may be denoted by a micro light-emitting diode. In an embodiment, the display apparatus 1 may be a quantum-dot light-emitting display apparatus.

The display apparatus 1 may be used as a display screen in various products including televisions, notebook computers, monitors, advertisement boards, Internet of things (IoTs) apparatuses as well as portable electronic apparatuses including mobile phones, smart phones, tablet personal computers (PCs), mobile communication terminals, electronic organizers, electronic books, portable multimedia players (PMPs), navigations, and ultra mobile personal computers (UMPCs). In addition, the display apparatus 1 according to an embodiment may be used in wearable devices including smartwatches, watchphones, glasses-type displays, and head-mounted displays (HMDs). In addition, in an embodiment, the display apparatus 1 may be used as a display screen in instrument panels for automobiles, center fascias for automobiles, or center information displays (CIDs) arranged on a dashboard, room mirror displays that replace side mirrors of automobiles, and displays arranged on the backside of front seats as an entertainment for back seats of automobiles.

Figure 2:
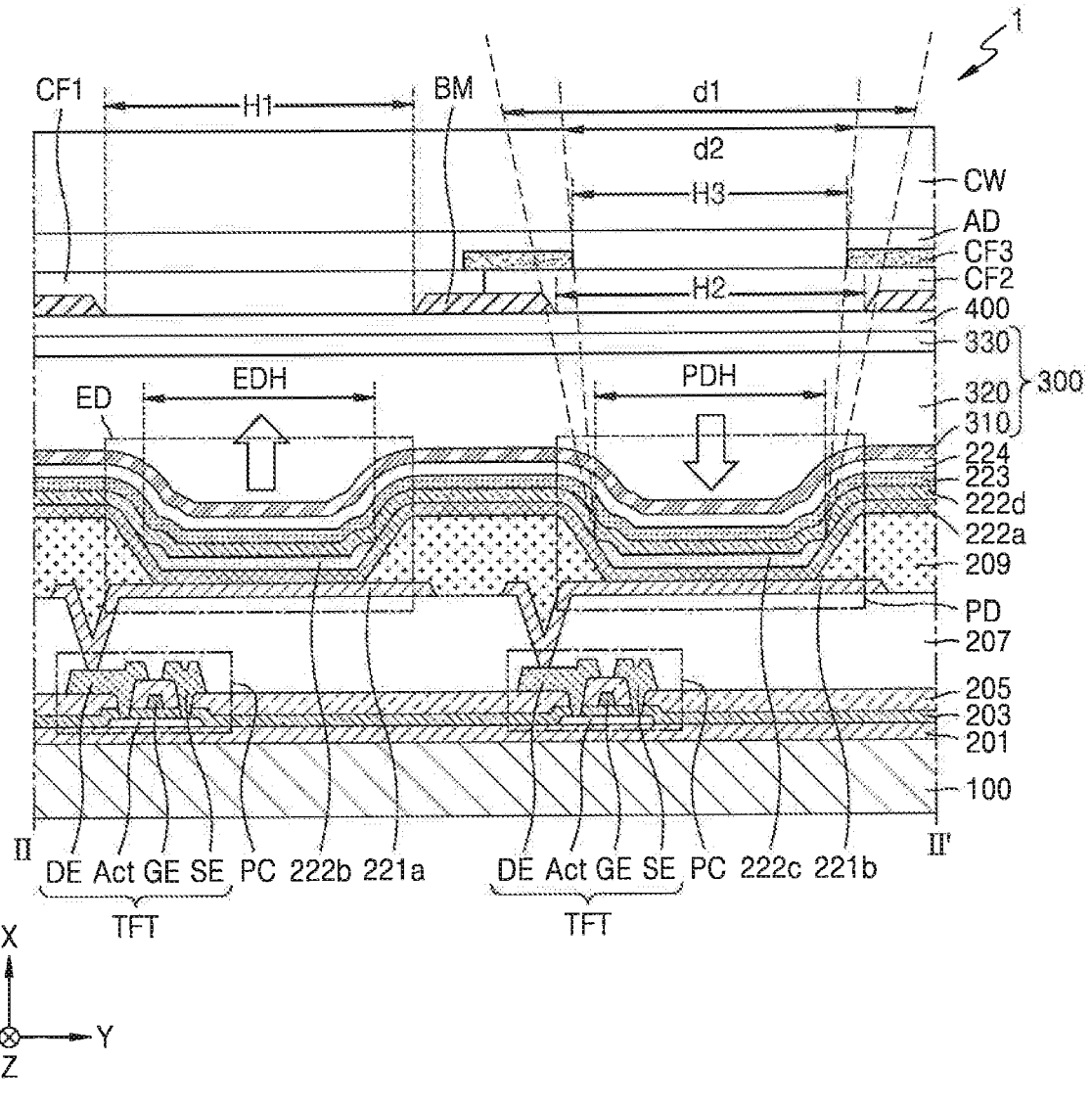
FIG. 2 is a cross-sectional view of the display apparatus, taken along line II-II' of FIG. 1 according to an embodiment of the present disclosure.

FIG. 2 is a cross-sectional view of the display apparatus 1, taken along line II-II' of FIG. 1 according to an embodiment.

Referring to FIG. 2, the display apparatus 1 may include a substrate 100, a thin-film transistor TFT, a light-emitting element ED, a photodetector PD, an auxiliary layer 224, an encapsulation layer 300, an input sensing layer 400, an anti-reflection layer, and a cover window CW.

In an embodiment, the substrate 100 may include glass or a polymer resin. As an example, in an embodiment in which the substrate 100 includes a polymer resin, the substrate 100 may include one of polyimide, polyethylene naphthalate, polyethylene terephthalate, polyarylate, polycarbonate, polyetherimide, and polyethersulfone. However, embodiments of the present disclosure are not necessarily limited thereto.

A buffer layer 201 may be disposed on (e.g., disposed directly thereon in the X direction) the substrate 100. The buffer layer 201 may reduce or block penetration of foreign materials, moisture, or external air from below the substrate 100. In an embodiment, the buffer layer 201 may include an inorganic material such as silicon oxide, silicon oxynitride, and silicon nitride, and include a single-layer or a multi-layer including the above materials.

The thin-film transistor TFT may be arranged on the buffer layer 201. The thin-film transistor TFT may include a semiconductor layer Act, a gate electrode GE, a source electrode SE, and a drain electrode DE. Though an embodiment shown in FIG. 2 includes a top-gate type transistor in which the gate electrode GE is disposed over the semiconductor layer Act with a gate insulating layer 203 therebetween, embodiments of the present disclosure are not necessarily limited thereto. As an example, in an embodiment the thin-film transistor TFT may be a bottom-gate type transistor.

The semiconductor layer Act may be disposed on (e.g., disposed directly thereon in the X direction) the buffer layer 201. The semiconductor layer Act may include a channel region, a drain region, and a source region. The drain region and the source region may be doped with impurities and may be positioned respectively on two opposite sides of the channel region. In an embodiment, the impurities may include N-type impurities or P-type impurities. In an embodiment, the semiconductor layer Act may include amorphous silicon or polycrystalline silicon. However, embodiments of the present disclosure are not necessarily limited thereto. For example, in an embodiment, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In addition, the semiconductor layer Act may include Zn-oxide-based material and include Zn-oxide, In—Zn oxide, and Ga—In—Zn oxide. In addition, the semiconductor layer Act may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

The gate electrode GE may be disposed over the semiconductor layer Act to overlap at least a portion of the semiconductor layer Act (e.g., in the X direction). For example, the gate electrode GE may overlap the channel region of the semiconductor layer Act. In an embodiment, the gate electrode GE may include various conductive materials including molybdenum (Mo), aluminum (Al), copper (Cu), titanium (Ti), and the like and have various layered structures. As an example, the gate electrode GE may include a Mo layer and an Al layer or have a multi-layered structure of a Mo layer/Al layer/Mo layer. In addition, the gate electrode GE may have a multi-layered structure including an indium tin oxide (ITO) layer covering a metal material.

The gate insulating layer 203 may be disposed between the semiconductor layer Act and the gate electrode GE. In an embodiment, the gate insulating layer 203 may include an inorganic insulating material including silicon oxide, silicon nitride, silicon oxynitride, aluminum oxide, titanium oxide, tantalum oxide, hafnium oxide and the like. The gate insulating layer 203 may include a single layer or a multi-layer including the above materials.

The source electrode SE and the drain electrode DE may be connected to a source region and a drain region of the semiconductor layer Act through contact holes, respectively. In an embodiment, the source electrode SE and the drain electrode DE may each include various conductive materials including molybdenum (Mo), aluminum (Al), copper (Cu), titanium (Ti), and the like and have various layered structures. As an example, the source electrode SE and the drain electrode DE may each include a Ti layer and an Al layer or have a multi-layered structure of a Ti layer/Al layer/Ti layer. In addition, the source electrode SE and the drain electrode DE may each have a multi-layered structure including an indium tin oxide (ITO) layer covering a metal material.

In an embodiment, an interlayer insulating layer 205 may be disposed on (e.g., disposed directly thereon in the X direction) the gate insulating layer 203. In an embodiment, the interlayer insulating layer 205 may include an inorganic insulating material including silicon oxide, silicon nitride, silicon oxynitride, aluminum oxide, titanium oxide, tantalum oxide, hafnium oxide and the like. In addition, the interlayer insulating layer 205 may include a single layer or a multi-layer including the above materials.

Though the gate insulating layer 203 and the interlayer insulating layer 205 including the inorganic material may be formed by chemical vapor deposition (CVD) or atomic layer deposition (ALD), embodiments of the present disclosure are not necessarily limited thereto.

The thin-film transistor TFT may be covered by an organic insulating layer 207. As an example, the organic insulating layer 207 may cover the source electrode SE and the drain electrode DE. The organic insulating layer 207 is a planarization insulating layer and may include an approximately flat upper surface (e.g., extending in the Y direction). In an embodiment, the organic insulating layer 207 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the organic insulating layer 207 may include polyimide.

A first electrode 221a, a second electrode 221b, and a pixel-defining layer 209 may be disposed on the organic insulating layer 207. In an embodiment, the pixel-defining layer 209 may cover edges (e.g., lateral edges in the Y direction) of the first electrode 221a and the second electrode 221b and be disposed on the organic insulating layer 207.

A light-emission opening EDH and a light-receiving opening PDH may be disposed in the pixel-defining layer 209. In an embodiment, the light-emission opening EDH exposes at least a central portion of the first electrode 221a, and the light-receiving opening PDH exposes at least a portion of the second electrode 221b. The pixel-defining layer 209 may prevent arcs and the like from occurring at the edges of the first electrodes 221a by increasing a distance between the edges of the first electrode 221a and the opposite electrode 223. In addition, the pixel-defining layer 209 may prevent arcs and the like from occurring at the edges of the second electrodes 221b by increasing a distance between the edges of the second electrode 221b and the opposite electrode 223.

In an embodiment, the pixel-defining layer 209 may include an organic insulating material such as polyimide, polyamide, an acryl resin, benzocyclobutene, hexamethyldisiloxane (HMDSO), and a phenolic resin, and be formed by spin coating and the like.

An emission layer 222b may be disposed in the light-emission opening EDH disposed in the pixel-defining layer 209. In an embodiment, the emission layer 222b may include an organic material including a fluorescent or phosphorous material emitting red, green, blue, or white light. However, embodiments of the present disclosure are not necessarily limited thereto. The emission layer 222b may be an organic emission layer including a low-molecular weight organic material or a polymer organic material. As an example, the emission layer 222b is an organic emission layer and may include copper phthalocyanine, tris-8-hydroxyquinoline aluminum, poly-phenylenevinylene-based material, or polyfluorene-based material.

In an embodiment, the emission layer 222b may include a host material and a dopant material. The dopant material is a material configured to emit light of a preset color and may include a light-emitting material. The light-emitting material may include at least one of phosphorescent dopants, fluorescent dopants, and quantum dots. The host material is a main material of the emission layer 222b and is a material that helps the dopant material to emit light.

An active layer 222c may be disposed in the light-receiving opening PDH disposed in the pixel-defining layer 209. The active layer 222c may include a p-type organic semiconductor and an n-type organic semiconductor. In an embodiment, the p-type organic semiconductor may act as an electron donor, and the n-type organic semiconductor may act as an electron acceptor.

In an embodiment, the active layer 222c may be a mixed layer in which the p-type organic semiconductor and the n-type organic semiconductor are mixed with each other. In this embodiment, the active layer 222c may be formed by co-depositing the p-type organic semiconductor and the n-type organic semiconductor. In an embodiment in which the active layer 222c is a mixed layer, excitons may be generated within a diffusion length from a donor-acceptor interface.

In an embodiment, the p-type organic semiconductor may be a compound acting as an electron donor configured to supply electrons. For example, the p-type organic semiconductor may include boron subphthalocyanine chloride (SubPc), copper(II) phthalocyanine (CuPc), tetraphenyldibenzoperiplanthene (DBP), or any combination thereof. However, embodiments of the present disclosure are not necessarily limited thereto.

In an embodiment, the n-type organic semiconductor may be a compound acting as an electron acceptor configured to accommodate electrons. As an example, the n-type organic semiconductor may include C60 fullerene, C70 fullerene, or any combination thereof. However, embodiments of the present disclosure are not necessarily limited thereto.

In an embodiment, the opposite electrode 223 may be disposed on the emission layer 222b and the active layer 222c. The opposite electrode 223 may be a light transmissive electrode or a reflective electrode. In an embodiment, the opposite electrode 223 may be a transparent or semi-transparent electrode and may include a metal thin film including Li, Ca, LiF/Ca, LiF/Al, Al, Ag, Mg, or a compound thereof and having a relatively small work function. In addition, the opposite electrode 223 may further include a transparent conductive oxide (TCO) layer such as ITO, indium zinc oxide (IZO), ZnO, or $In_2O_3$ as well as the metal thin film.

In an embodiment, a first common layer 222a may be disposed between the first electrode 221a and the emission layer 222b and between the second electrode 221b and the active layer 222c. A second common layer 222d may be disposed between the emission layer 222b and the opposite electrode 223 and between the active layer 222c and the opposite electrode 223.

In an embodiment, a hole transport region may be defined between the first electrode 221a and the emission layer 222b and between the second electrode 221b and the active layer 222c. An electron transport region may be defined between the emission layer 222b and the opposite electrode 223 and between the active layer 222c and the opposite electrode 223.

The hole transport region may have a single-layered structure or a multi-layered structure. As an example, the first common layer 222a may be arranged in the hole transport region. In an embodiment, the first common layer 222a may include at least one of a hole injection layer (HIL), a hole transport layer (HTL), and an electron blocking layer (EBL).

As an example, the first common layer 222a may have a single-layered structure or a multi-layered structure. In an embodiment in which the first common layer 222a has a multi-layered structure, the first common layer 222a may include an HIL and HTL sequentially stacked from the first electrode 221a, include an HIL and an EBL, include an HTL and an EBL, or include an HIL, an HTL, and an EBL. However, embodiments of the present disclosure are not necessarily limited thereto.

In an embodiment, the first common layer 222a may include at least one of m-MTDATA, TDATA, 2-TNATA, NPB (NPD), β-NPB, TPD, spiro-TPD, spiro-NPB, methyl-ated-NPB, TAPC, HMTPD, TCTA (4, 4',4"-tris(N-carba-zolyl)triphenylamine (4,4',4"-tris(N-carbazolyl)triph-enylamine)), pani/DBSA (polyaniline/dodecylbenzenesulfonic acid), pani/CSA (polyaniline/camphor sulfonic acid)), PEDOT/PSS (poly(3,4-ethylenedioxythiophene)/poly(4-styrenesulfonate) (poly(3, 4-ethylenedioxythiophene))/poly(4-styrenesulfonate))) and PANI/PSS (polyaniline/poly(4-styrenesulfonate) (polyani-line/poly(4-styrenesulfonate))).

The electron transport region may have a single-layered structure or a multi-layered structure. As an example, the second common layer 222d may be arranged in the electron transport region. In an embodiment, the second common layer 222d may include at least one of an electron injection layer (EIL), an electron transport layer (ETL), and a hole blocking layer (HBL).

As an example, the second common layer 222d may have a single-layered structure or a multi-layered structure. In an embodiment in which the second common layer 222d has a multi-layered structure, the second common layer 222d may include an ETL and EIL sequentially stacked (e.g., in the X direction) from the emission layer 222b, include an HBL and an EIL, include an HBL and an ETL, or include an HBL, an ETL, and an EIL. However, embodiments of the present disclosure are not necessarily limited thereto.

In an embodiment, the second common layer 222d may include at least one compound among BCP (2,9-dimethyl-4,7-diphenyl-1,10-phenanthroline), Bphen (4,7-Diphenyl-1, 10-phenanthroline), Alq3, BAlq, TAZ (3-(biphenyl-4-yl)-5-(4-tert-butylphenyl)-4-phenyl-4H-1,2,4-triazole) and NTAZ.

The light-emitting element ED may include the first electrode 221a, the first common layer 222a, the emission layer 222b, the second common layer 222d, and the opposite electrode 223 sequentially stacked (e.g., in the X direction). The photodetector PD may include the second electrode 221b, the first common layer 222a, the active layer 222c, the second common layer 222d, and the opposite electrode 223 sequentially stacked (e.g., in the X direction).

The thin-film transistor TFT may be disposed between the substrate 100 and the light-emitting element ED (e.g., in the X direction). The thin-film transistor TFT may be electri-cally connected to the light-emitting element ED to drive the light-emitting element ED. As an example, one of the source electrode SE and the drain electrode DE of the thin-film transistor TFT may be electrically connected to the first electrode 221a of the light-emitting element ED.

The thin-film transistor TFT may be disposed between the substrate 100 and the photodetector PD (e.g., in the X direction). The thin-film transistor TFT may be electrically connected to the photodetector PD to drive the photodetector PD. As an example, one of the source electrode SE and the drain electrode DE of the thin-film transistor TFT may be electrically connected to the first electrode 221a of the light-emitting element ED.

The active layer 222c may receive light from the outside to generate an exciton, and then, divide the generated exciton into a hole and an electron. In an embodiment in which a (+) electric potential is applied to the first electrode 221a and a (−) electric potential is applied to the opposite electrode 223, holes separated inside the active layer 222c may move toward the opposite electrode 223 and electrons separated inside the active layer 222c may move toward the first electrode 221a. Accordingly, a light current may be formed in a direction from the first electrode 221a to the opposite electrode 223.

In an embodiment in which a bias is applied between the first electrode 221a and the opposite electrode 223, a dark current may flow through the photodetector PD. In addition, in an embodiment in which light is incident to the photo-detector PD, a light current may flow through the photode-tector PD. In an embodiment, the photodetector PD may be configured to detect the amount of light based on a ratio of a light current and a dark current.

The auxiliary layer 224 may be disposed on the light-emitting element ED and the photodetector PD, As an example, the auxiliary layer 224 may be disposed on the opposite electrode 223. The auxiliary layer 224 may lower an energy barrier of holes moving in a direction of a hole transport layer and an anode and serve to facilitate the movement of holes. In an embodiment, the auxiliary layer 224 may include, for example, a fluorene-based compound, a carbazole-based compound, a diarylamine-based com-pound, a triarylamine-based compound, a dibenzofuran-based compound, a dibenzothiophene-based compound, a dibenzosilol-based compound, or any combination thereof.

The encapsulation layer 300 may be disposed on the light-emitting element ED and the photodetector PD. As an example, the encapsulation layer 300 may be disposed on (e.g., disposed directly thereon in the X direction) the auxiliary layer 224. The encapsulation layer 300 may include at least one inorganic encapsulation layer and at least one organic encapsulation layer. In an embodiment as shown in FIG. 2, the encapsulation layer 300 may include a first inorganic encapsulation layer 310, an organic encapsulation layer 320, and a second inorganic encapsulation layer 330 that are sequentially stacked (e.g., in the X direction).

In an embodiment, the first inorganic encapsulation layer 310 and the second inorganic encapsulation layer 330 may include at least one inorganic material from among alumi-num oxide, titanium oxide, tantalum oxide, hafnium oxide, zinc oxide, silicon oxide, silicon nitride, and silicon oxyni-tride. The organic encapsulation layer 320 may include a polymer-based material. The polymer-based material may include an acryl-based resin, an epoxy-based resin, polyim-ide, and polyethylene. In an embodiment, the organic encap-sulation layer 320 may include acrylate. The organic encap-sulation layer 320 may be formed by curing a monomer or coating a polymer. The organic encapsulation layer 320 may be transparent.

The input sensing layer 400 may be disposed on (e.g., disposed directly thereon in the X direction) the encapsula-tion layer 300. The input sensing layer 400 may obtain coordinate information corresponding to an external input, for example, a touch event.

The anti-reflection layer may be disposed on the encap-sulation layer 300. The anti-reflection layer may include a light-blocking layer BM, a first color filter CF1, a second color filter CF2, and a third color filter CF3.

The light-blocking layer BM may be disposed on the input sensing layer 400. For example, in an embodiment a lower surface of the light-blocking layer BM may be dis-posed directly on an upper surface of the input sensing layer 400. The light-blocking layer BM may at least partially absorb external light or internal reflected light. In an embodiment, the light-blocking layer BM may include black pigment. The light-blocking layer BM may be a black matrix. The light-blocking layer BM may include a first hole H1 and a second hole H2. The first hole H1 is disposed over the light-emitting element ED, and the second hole H2 is disposed over the photodetector PD. For example, the first hole H1 may overlap the light-emitting element ED in the X direction and the second hole H2 may overlap the photodetector PD in the X direction. In an embodiment, the area of the first hole H1 may be greater than or equal to the area of the light-emission opening EDH disposed in the pixel-defining layer 209. In addition, the area of the second hole H2 may be greater than or equal to the area of the light-receiving opening PDH disposed in the pixel-defining layer 209. In an embodiment, these areas may be defined in a plane extending in the Y and Z directions. For example, the length of the first hole H1 in the Y direction may be greater than or equal to the length of the light-emission opening EDH in the Y direction. The length of the second hole H2 in the Y direction may be greater than or equal to the length of the light-receiving opening PDH in the Y direction.

The first color filter CF1 may be arranged to cover the first hole H1. The first color filter CF1 may be connected to (e.g., directly contact) the light-blocking layer BM to fill the first hole H1. The second color filter CF2 may be arranged to cover the second hole H2. The second color filter CF2 may be connected to (e.g., directly contact) the light-blocking layer BM to fill the second hole H2. The first color filter CF1 and the second color filter CF2 may be connected to each other with the light blocking layer BM as a boundary. For example, the light blocking layer BM may be disposed under (e.g., in the X direction) the portions of the first color filter CF1 and the second color filter CF2 that directly contact each other.

The third color filter CF3 may be arranged to overlap a portion of the second hole H2 (e.g., in the X direction). For example, in an embodiment a bottom surface of the third color filter CF3 may directly contact a portion of an upper surface of the second color filter CF2 disposed in the second hole H2. A third hole H3 may be disposed in the third color filter CF3. The third hole H3 is disposed over the light-receiving opening PDH and may overlap a portion of the second hole H2 (e.g., in the X direction). For example, the third hole H3 may overlap the light-receiving opening PDH and a portion of the second hole H2 (e.g., in the X direction). The area of the third hole H3 disposed in the third color filter CF3 may be less than the area of the second hole H2 disposed in the light-blocking layer BM. The area may be defined in a plane extending in the Y and Z directions. For example, as shown in FIG. 2, a length of the third hole H3 in the Y direction may be less than the length of the second hole H2 in the Y direction.

The first color filter CF1, the second color filter CF2, and the third color filter CF3 may transmit only light having a wavelength in a specific band.

The first color filter CF1 may transmit light emitted from the light-emitting element ED. As an example, the light-emitting element ED may be configured to emit green light or red light. In an embodiment in which the light-emitting element ED is configured to emit green light, the first color filter CF1 may be a green color filter configured to transmit green light. In addition, in an embodiment in which the light-emitting element ED is configured to emit red light, the first color filter CF1 may be a red color filter configured to transmit red light.

The second color filter CF2 may be configured to transmit light of the same color as a color of the first color filter CF1. In an embodiment in which the first color filter CF1 is a green color filter, the second color filter CF2 may be a green color filter. In addition, in an embodiment in which the first color filter CF1 is a red color filter, the second color filter CF2 may be a red color filter.

The third color filter CF3 may be a blue color filter configured to absorb green light and red light and transmit blue light.

The cover window CW may be disposed on the anti-reflection layer. In an embodiment, the cover window CW may include at least one of glass, sapphire, and plastic. The cover window CW may be, for example, ultra-thin glass (UTG) or colorless polyimide (CPI).

An adhesive member AD may be disposed between the cover window CW and the anti-reflection layer (e.g., in the X direction). Accordingly, the adhesive layer AD may couple the cover window CW to the anti-reflection layer. In an embodiment, the adhesive member AD may be any general adhesive member known in the art without limitation. The adhesive member AD may be a pressure sensitive adhesive (PSA).

Green light or red light emitted from the light-emitting element ED may pass through the first color filter CF1 covering the first hole and then pass through the cover window CW. In an embodiment in which an object to be sensed is disposed on the cover window CW, light passing through the cover window CW may be reflected by the object. The light reflected by the object may pass through the second color filter CF2 covering the second hole H2 and be incident to the photodetector PD. The photodetector PD may detect the light reflected by the object and sense the object.

In this embodiment, the light reflected by the object and incident to the third color filter CF3 may be green light or red light. Accordingly, the light incident to the third color filter CF3 may be absorbed by the third color filter CF3 which is the blue color filter. For example, the light incident to the third color filter CF3 cannot reach the photodetector PD. In this structure, among light reflected by the object, only light passing through the third hole H3 disposed in the third color filter CF3 may reach the photodetector PD.

The resolution of the photodetector PD may be determined by a resolution distance between both ends on the cover window CW of light reaching the photodetector PD. Since the third color filter CF3 absorbs a portion of light reflected by the object, the resolution distance may be reduced from d1 to d2. Accordingly, since the third color filter CF3 is arranged to overlap a portion of the second hole H2, the resolution of the photodetector PD may increase.

Figure 3A:
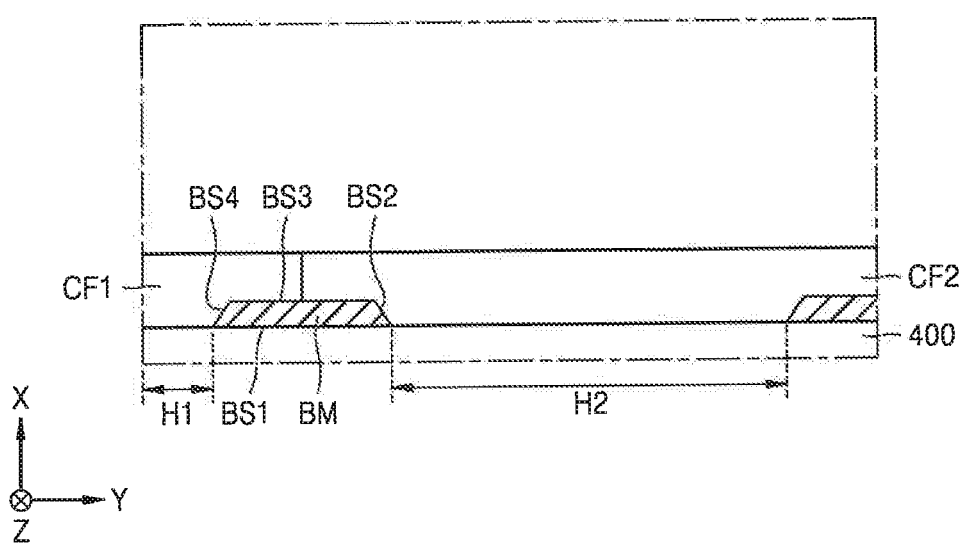
FIGS. 3A to 3C are cross-sectional views for explaining a method of manufacturing a display apparatus according to embodiments of the present disclosure.
Figure 3B:
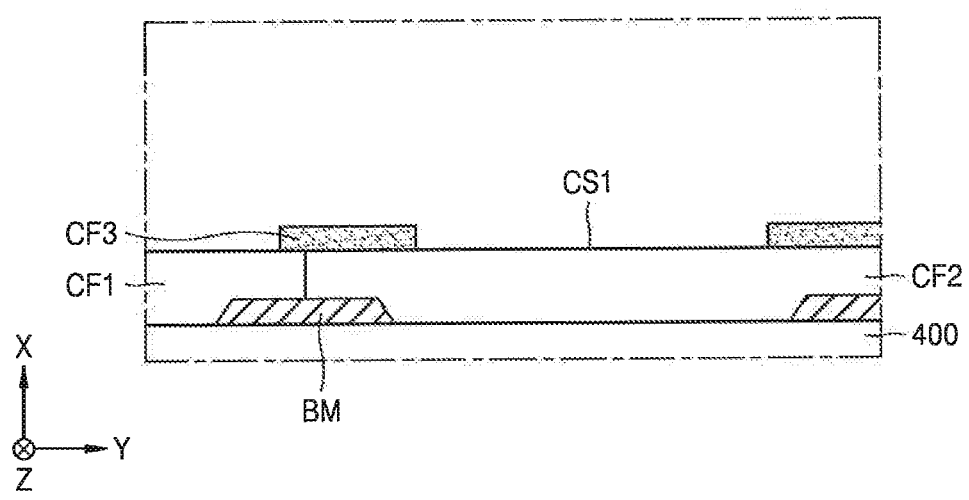
Figure 3C:
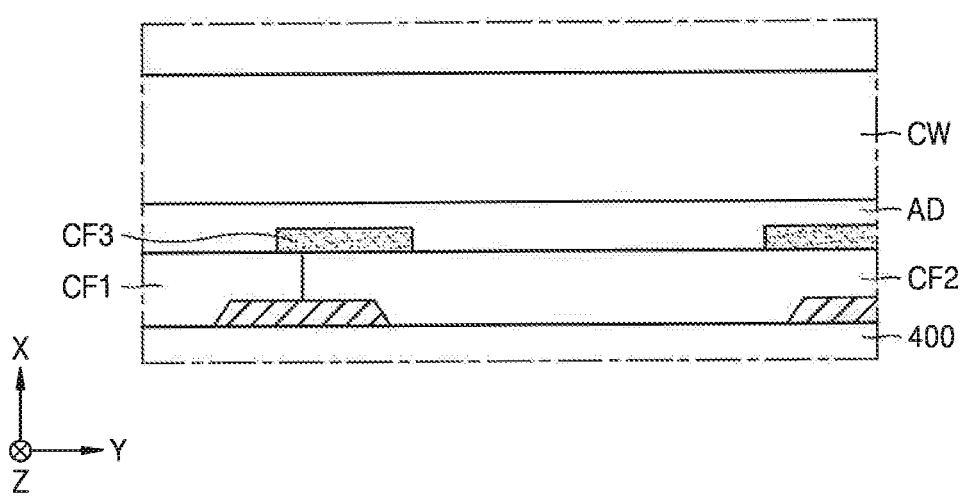

FIGS. 3A to 3C are cross-sectional views for explaining a method of manufacturing a display apparatus according to embodiments of the present disclosure.

Referring to FIG. 3A, the light-blocking layer BM may be disposed on the input sensing layer 400. For example, in an embodiment a lower surface of the light-blocking layer BM may be disposed directly on an upper surface of the light-blocking layer BM. In an embodiment, the light-blocking layer BM may include a first side BS1, a second side BS2, a third side BS3, and a fourth side BS4. The first side BS1 faces the substrate, the second side BS2 forms an inner surface of the second hole H2, the third side BS3 faces a direction in which light is emitted from the light-emitting element ED and opposes the first side BS1 (see FIG. 2), and the fourth side BS4 forms an inner surface of the first hole H1 and opposes the second side BS2. The first side BS1 of the light-blocking layer BM may be connected to the input sensing layer 400. For example, the first side BS1 of the light-blocking layer BM may directly contact the input sensing layer 400.

The light-blocking layer BM is disposed on the input sensing layer 400, and then, the first color filter CF1 and the second color filter CF2 may be disposed on the light-blocking layer BM. The first color filter CF1 may be arranged to cover the first hole H1. The first color filter CF1 may be disposed on the input sensing layer 400 and connected to the light-blocking layer BM to directly contact the third side BS3 and the fourth side BS4 of the light-blocking layer BM. The second color filter CF2 may be arranged to cover the second hole H2. The second color filter CF2 may be disposed on the input sensing layer 400 and connected to the light-blocking layer BM to directly contact the second side BS2 and the third side BS3 of the light-blocking layer BM. The first color filter CF1 and the second color filter CF2 may be connected to each other with the light blocking layer BM as a boundary.

Referring to FIG. 3B, the first color filter CF1 and the second color filter CF2 are disposed on the light-blocking layer BM, and then, at least a portion of the third color filter CF3 may be disposed on the second color filter CF2. For example, a lower surface of the third color filter CF3 may directly contact an upper surface of the second color filter CF2. The third color filter CF3 may be connected to one surface CS1 of the second color filter CF2 facing a direction in which light is emitted. For example, the one surface CS1 may be an upper surface of the second color filter CF2 in the X direction. Though it is shown in FIG. 3B that the third color filter CF3 is connected to the first color filter CF1, in an embodiment the third color filter CF3 may be spaced apart from the first color filter CF1. In an embodiment, the third color filter CF3 may be manufactured by using an ultraviolet (UV) photocuring method. Accordingly, the size and shape of the third hole H3 disposed in the third color filter CF3 may be precisely adjusted.

Referring to FIG. 3C, the cover window CW may be disposed on the first color filter CF1, the second color filter CF2, and the third color filter CF3. An adhesive member AD is disposed on the first color filter CF1, the second color filter CF2, and the third color filter CF3, and then, the cover window CW may be disposed on (e.g., directly thereon in the X direction) the adhesive member AD.

Figure 4:
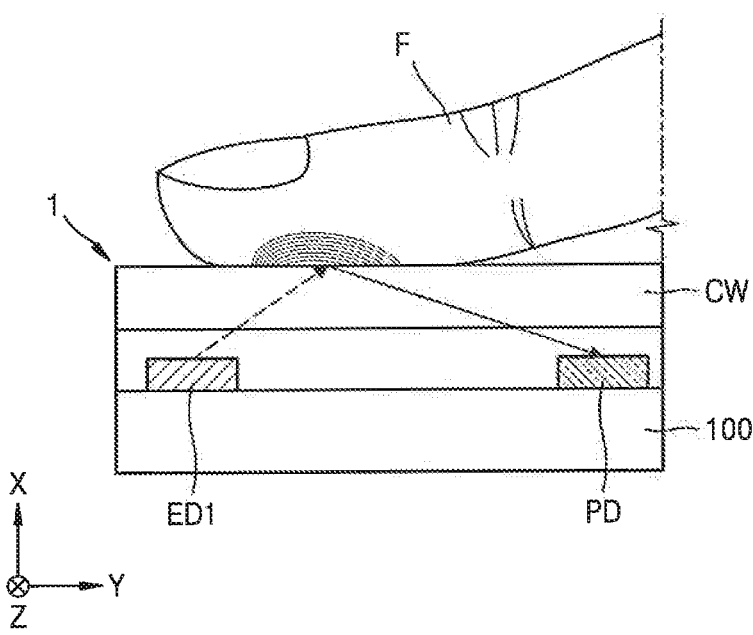
FIG. 4 is a schematic cross-sectional view of a display apparatus according to an embodiment of the present disclosure.

FIG. 4 is a schematic cross-sectional view of the display apparatus 1 according to an embodiment.

Referring to FIG. 4, in an embodiment an object to be sensed, which is disposed on the cover window CW, may be a finger F. Accordingly, the display apparatus 1 may be configured to sense the fingerprint of the finger F. Among light emitted from the light-emitting element ED, at least a portion of reflected light reflected by a user's fingerprint is re-incident to the photodetector PD, and thus, the photodetector PD may be configured to detect the re-incident light. Since the ridge of the fingerprint pattern of the finger F is in close contact with the upper surface of the cover window OW, the photodetector PD may obtain the user's fingerprint pattern, for example, image information of the ridge.

The finger F shown in FIG. 4 is a mere example, and various different objects disposed on or in proximity to the cover window CW may be detected by the display apparatus. As an example, an object that is not in direct contact with the display apparatus may be an object to be detected by the display apparatus.

Figure 5:
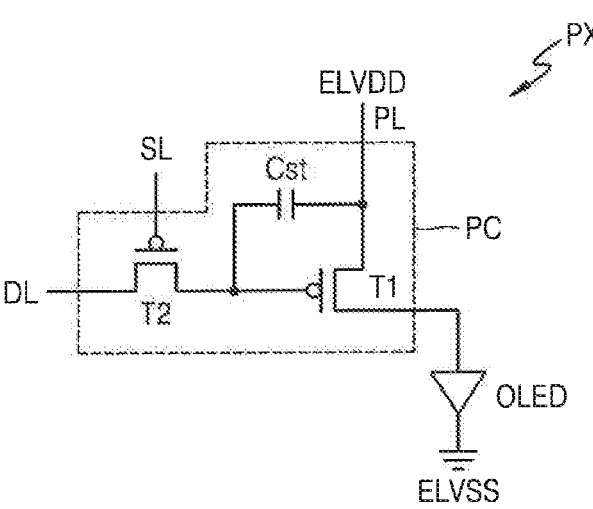
FIG. 5 is an equivalent circuit diagram of one of pixels in a display apparatus according to an embodiment of the present disclosure.

FIG. 5 is an equivalent circuit diagram of one of pixels in the display apparatus 1 according to an embodiment.

Each pixel PX may include a pixel circuit PC and a display element connected to the pixel circuit PC. In an embodiment, the display element may be, for example, an organic light-emitting diode OLED. The pixel circuit PC may include a first thin-film transistor T1, a second thin-film transistor T2, and a storage capacitor Cst. Each pixel PX may be configured to emit, for example, red, green, blue, or white light from the organic light-emitting diode OLED. However, embodiments of the present disclosure are not necessarily limited thereto and the colors emitted by the pixels PX may vary.

The second thin-film transistor T2 is a switching thin-film transistor. The second thin-film transistor T2 may be connected to a scan line SL and a data line DL, and may be configured to transfer a data voltage to the first thin-film transistor T1 based on a switching voltage. The data voltage may be input from the data line DL and the switching voltage may be input from the scan line SL. The storage capacitor Cst may be connected to the second thin-film transistor T2 and a driving voltage line PL and configured to store a voltage corresponding to a difference between a voltage transferred from the second thin-film transistor T2 and a first power voltage ELVDD supplied to the driving voltage line PL.

The first thin-film transistor T1 is a driving thin-film transistor. The first thin-film transistor T1 may be connected to the driving voltage line PL and the storage capacitor Cst, and may be configured to control a driving current according to the voltage stored in the storage capacitor Cst. The driving current may be the current flowing from the driving voltage line PL to the organic light-emitting diode OLED. The organic light-emitting diode OLED may emit light having a preset brightness corresponding to the driving current. An opposite electrode (e.g., a cathode) of the organic light-emitting diode OLED may receive a second power voltage ELVSS.

Though it is described with reference to FIG. 5 that the pixel circuit PC includes two thin-film transistors and one storage capacitor, embodiments of the present disclosure are not necessarily limited thereto. The number of thin-film transistors and the number of storage capacitors may be variously changed according to the design of the pixel circuit PC. As an example, the pixel circuit PC may further include four or more thin-film transistors as well as the two thin-film transistors.

Figure 6A:
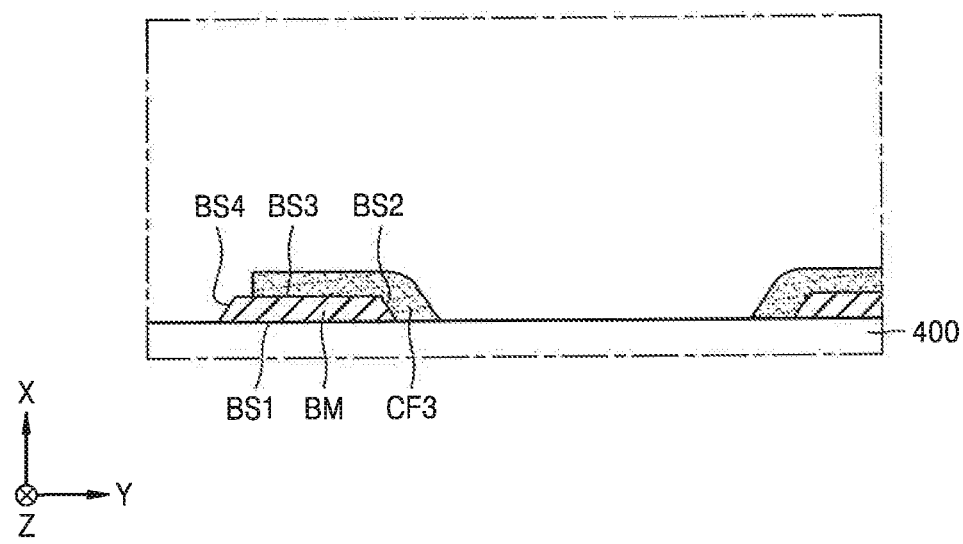
FIGS. 6A to 6C are cross-sectional views for explaining a method of manufacturing a display apparatus according to embodiments of the present disclosure.
Figure 6B:
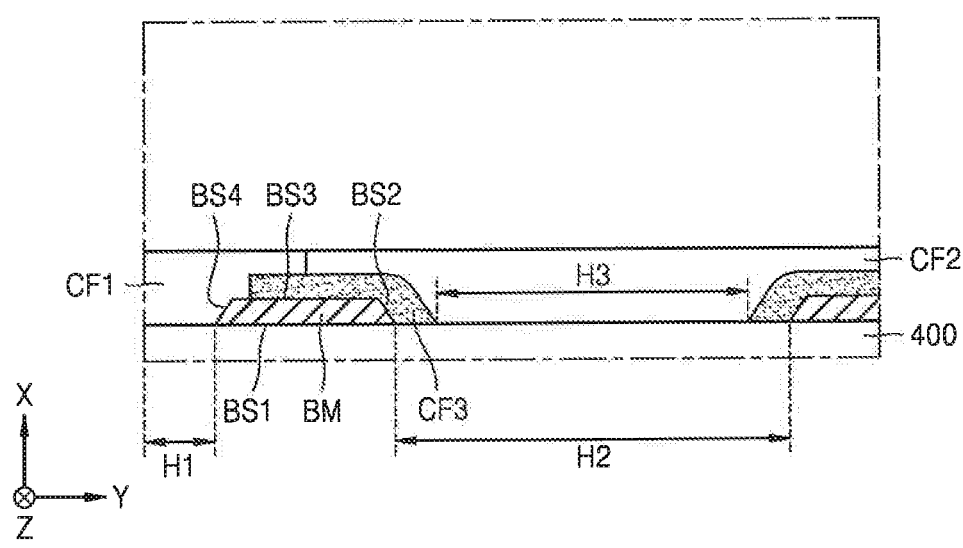
Figure 6C:
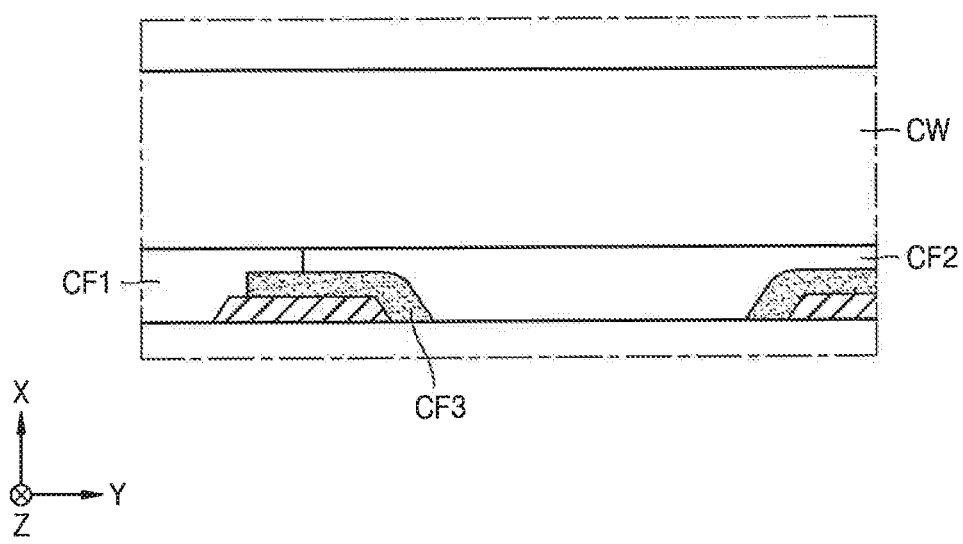

FIGS. 6A to 6C are cross-sectional views for explaining a method of manufacturing the display apparatus 1 according to embodiments of the present disclosure. Descriptions that are the same as or similar to those described with reference to FIGS. 1 to 5 are omitted, for convenience of description.

Referring to FIG. 6A, the light-blocking layer BM may be disposed on (e.g., disposed directly thereon in the X direction) the input sensing layer 400. The first side BS1 of the light-blocking layer BM may be connected to (e.g., may directly contact) the input sensing layer 400. The light-blocking layer BM is disposed on the input sensing layer 400, and then, at least a portion of the third color filter layer CF3 may be disposed on the light-blocking layer BM. The third color filter CF3 may be connected to (e.g., may directly contact) the second side BS2 and the third side BS3 of the light-blocking layer BM.

Referring to FIG. 6B, at least a portion of the third color filter CF3 is disposed on the light-blocking layer BM, and then, at least portions of the first color filter CF1 and the second color filter CF2 may be disposed on (e.g., disposed directly thereon) the third color filter CF3. The first color filter CF1 may be arranged to cover the first hole H1. The first color filter CF1 may be disposed on the input sensing layer 400 and connected to (e.g., directly contact) the light-blocking layer BM and the third color filter CF3. As an example, the first color filter CF1 may be connected to (e.g., directly contact) at least a portion of the third color filter CF3, at least a portion of the third side BS3 of the light-blocking layer BM, and the fourth side BS4 of the light-blocking layer BM. As shown in an embodiment of FIG. 6B, a portion of the third color filter CF3 may be disposed under the first color filter CF1 (e.g., in the X direction).

The second color filter CF2 may be arranged to cover the second hole H2. The second color filter CF2 may be connected to (e.g., directly contact) the third color filter CF3, and at least a portion of the second color filter CF2 may be disposed higher than the third color filter CF3. For example, at least a portion of the third color filter CF3 is disposed under the second color filter CF2 (e.g., in the X direction). The third color filter CF3 may cover a portion of the second hole H2. In this structure, at least a portion of the third color filter CF3 may be disposed between the light-blocking layer BM and the second color filter CF2 (e.g., in the X direction). The first color filter CF1 and the second color filter CF2 may be connected to each other with the light-blocking layer BM and the third color filter CF3 as a boundary.

Referring to FIG. 6C, the cover window CW may be disposed on the first color filter CF1, the second color filter CF2, and the third color filter CF3. The cover window CW may be connected to the upper surfaces of the first color filter CF1 and the second color filter CF2.

Figure 7A:
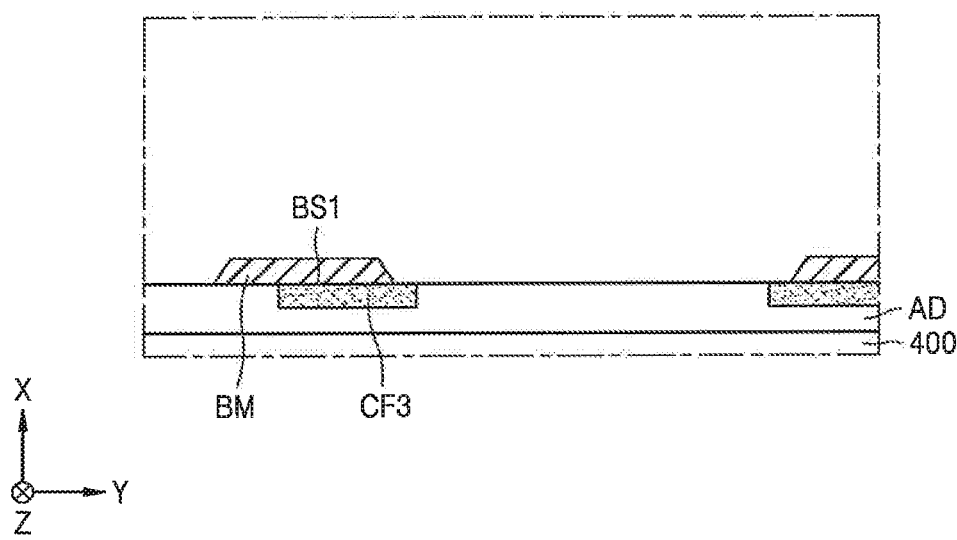
FIGS. 7A to 7C are cross-sectional views for explaining a method of manufacturing a display apparatus according to embodiments of the present disclosure.
Figure 7B:
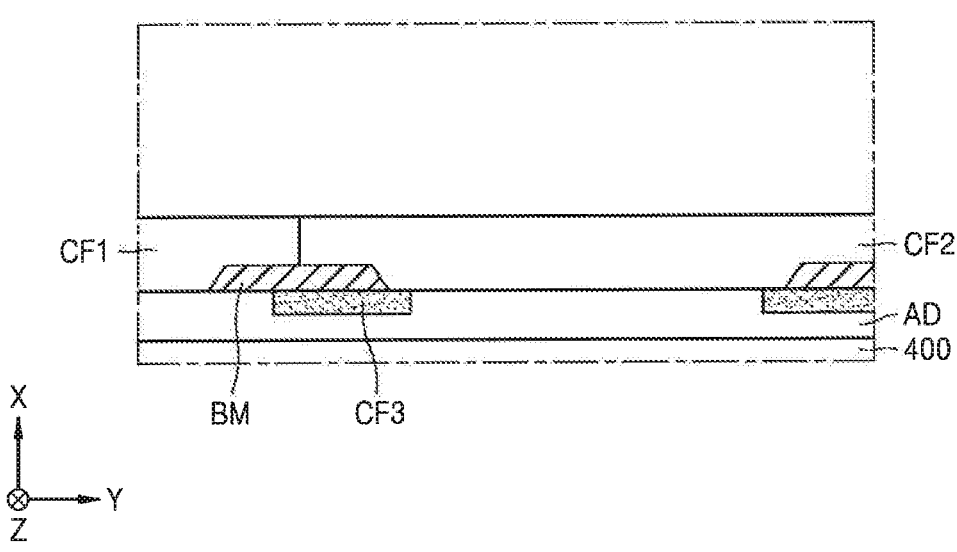
Figure 7C:
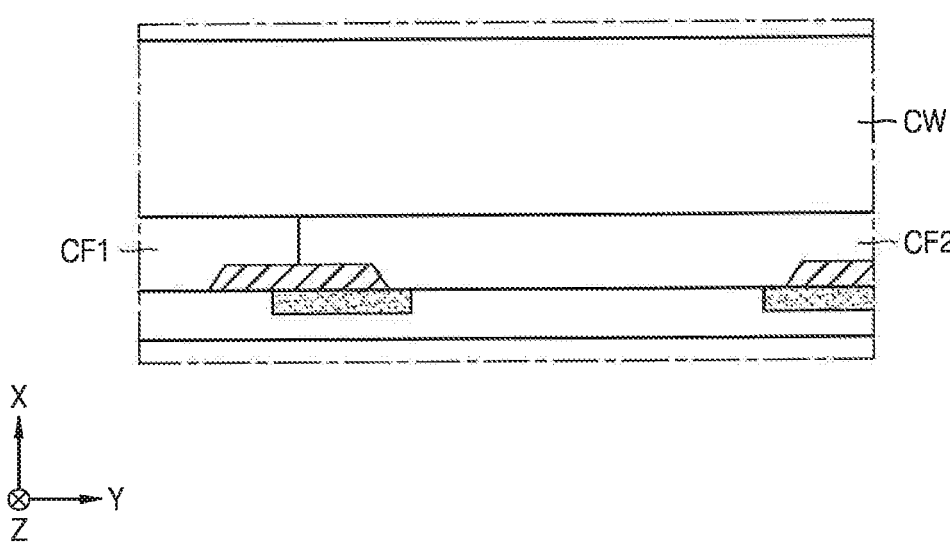

FIGS. 7A to 7C are cross-sectional views for explaining a method of manufacturing a display apparatus according to embodiments of the present disclosure. Descriptions that are the same as or similar to those described with reference to FIGS. 1 to 5 are omitted, for convenience of description.

Referring to FIG. 7A, the third color filter CF3 and the light-blocking layer BM may be disposed on the input sensing layer 400. The third color filter CF3 is disposed on the input sensing layer 400, and then, at least a portion of the light-blocking layer BM may be disposed on (e.g., disposed directly thereon in the X direction) the third color filter CF3. The third color filter CF3 may be connected to (e.g., directly contact) the first side BS1 of the light-blocking layer BM that faces the substrate 100. The adhesive member AD may be disposed between the light-blocking layer BM and the input sensing layer 400 and between the third color filter CF3 and the input sensing layer 400. In an embodiment as shown in FIG. 7A, the adhesive member AD may cover lateral sides and a bottom surface of the third color filter CF3.

Referring to FIG. 713, the first color filter CF1 may be arranged to cover the first hole H1. The first color filter CF1 may be disposed on the third color layer CF3 and connected to the light-blocking layer BM to contact (e.g., directly contact) the third side BS3 and the fourth side BS4 of the light-blocking layer BM.

The second color filter CF2 may be arranged to cover the second hole H2. The second color filter CF2 may be disposed on the third color layer CF3 and connected to the light-blocking layer SM to contact (e.g., directly contact) the second side BS2 and the third side BS3 of the light-blocking layer BM. The first color filter CF1 and the second color filter CF2 may be connected to each other with the light blocking layer BM as a boundary. In this structure, at least a portion of the third color filter CF3 may be disposed under the second color filter CF2 (e.g., in the X direction).

Referring to FIG. 7C, the cover window CW may be disposed on (e.g., disposed directly thereon in the X direction) the first color filter CF1 and the second color filter CF2. The cover window CW may be connected to (e.g, directly contact) the upper surfaces of the first color filter CF1 and the second color filter CF2.

Figure 8:
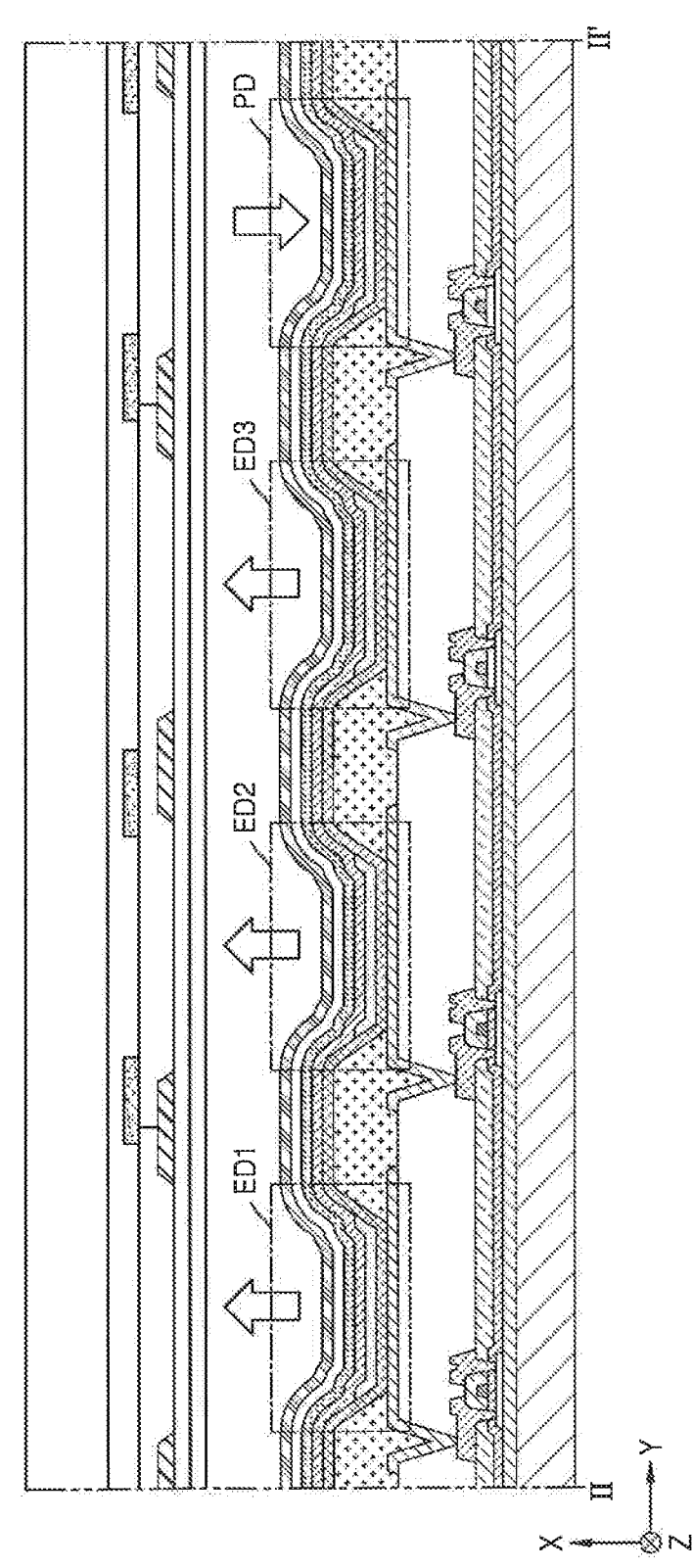
FIG. 8 is a cross-sectional view of the display apparatus, taken along line II-II' of FIG. 1 according to an embodiment of the present disclosure.
Figure 9:
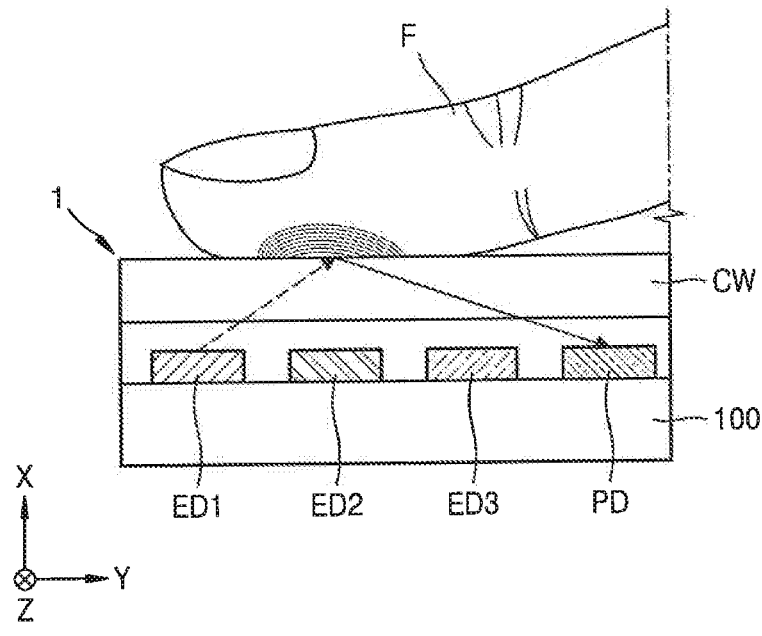
FIG. 9 is a schematic cross-sectional view of a display apparatus according to an embodiment of the present disclosure.

FIG. 8 is a cross-sectional view of the display apparatus 1, taken along line II-II' of FIG. 1 according to an embodiment, and FIG. 9 is a schematic cross-sectional view of the display apparatus 1 according to an embodiment.

Descriptions that are the same as or similar to those described with reference to FIGS. 1 to 5 are omitted, for convenience of description. In addition, the same reference numerals as those of FIGS. 1 to 5 denote the same members, and thus, repeated descriptions thereof are omitted.

Referring to FIG. 8, the light-emitting element ED may include the first light-emitting element ED1, the second light-emitting element ED2, and the third light-emitting element ED3.

In an embodiment, the first light-emitting element ED1 may be configured to emit light of a first color, the second light-emitting element ED2 may be configured to emit light of a second color, and the third light-emitting element ED3 may be configured to emit light of a third color. In this case, the light of the first color, the light of the second color, and the light of the third color may be red light, green light, and blue light, respectively. However, embodiments of the present disclosure are not necessarily limited thereto. As an example, the display apparatus 1 may be configured to emit full-color light. The light of the first color, the light of the second color, and the light of the third color are not limited to red light, green light, and blue light, respectively, as long as their mixed light is a combination of white light.

In the display apparatus 1, the first light-emitting element ED1, the second light-emitting element ED2, the third light-emitting element ED3, and the photodetector PD may each be a sub-pixel configuring one pixel. In an embodiment, one pixel may include at least one photodetector PD. The display apparatus 1 may include the photodetector PD, the first light-emitting element ED1, the second light-emitting element ED2, and the third light-emitting element ED3, and may be a full-color display apparatus having a light-detecting function.

Referring to FIG. 9, the first light-emitting element ED1, the second light-emitting element ED2, and the third light-emitting element ED3 may be configured to emit light of different colors. As an example, the first light-emitting element ED1 may be configured to emit green light, the second light-emitting element ED2 may be configured to emit red light, and the third light-emitting element ED3 may be configured to emit blue light.

As shown in FIG. 9, the display apparatus 1 may have a function of sensing an object, for example, the fingerprint of the finger F contacting the cover window CW. Among light emitted from at least one of the first light-emitting element ED1, the second light-emitting element ED2, and the third light-emitting element ED3, at least one of reflected light reflected by a user's fingerprint is re-incident to the photodetector PD. Accordingly, the photodetector PD may be configured to detect the reflected light. As an example, since green light emitted by the first light-emitting element ED1 is reflected by an object contacting the cover window CW and re-incident to the photodetector PD, the photodetector PD may be configured to detect the re-incident green light.

According to an embodiment, a user's fingerprint and the like may be sensed by increasing the resolution of the display apparatus.

Effects of embodiments of the present disclosure are not limited to the above mentioned effects and other effects not mentioned may be clearly understood by those of ordinary skill in the art from the following claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:
1. An electronic device, comprising:
  a display apparatus comprising:
  a substrate;
    a light-emitting element disposed on the substrate, the light-emitting element emits light;
    a photodetector disposed on the substrate, the photodetector detecting light;
    a light-blocking layer including a first hole and a second hole, the first hole is disposed above the light-emitting element, and the second hole is disposed above the photodetector;
    a first color filter disposed to cover the first hole;
    a second color filter disposed to cover the second hole; and
    a third color filter arranged to overlap a portion of the second hole, the third color filter reducing a resolution distance of light reaching the photodetector.
2. The electronic device of claim 1, wherein:
  the third color filter is a blue color filter transmitting blue light; and
    the first color filter is a green color filter transmitting green light, or a red color filter transmitting red light.
3. The electronic device of claim 1, wherein the second color filter transmits light of a same color as a color of the first color filter.
4. The electronic device of claim 1, wherein at least a portion of the third color filter is disposed on the second color filter.
5. The electronic device of claim 4, wherein the third color filter is connected to a first surface of the second color filter that faces a direction that the light is emitted.
6. The electronic device of claim 1, wherein at least a portion of the third color filter is disposed under the second color filter.
7. The electronic device of claim 6, wherein the third color filter is connected to a first surface of the light-blocking layer that faces the substrate.
8. The electronic device of claim 1, wherein at least a portion of the third color filter is disposed between the light-blocking layer and the second color filter.
9. The electronic device of claim 8, wherein the third color filter is connected to a second surface of the light-blocking layer that forms an inner surface of the second hole.
10. The electronic device of claim 8, wherein the third color filter is connected to a third surface of the light-blocking layer that faces a direction that the light is emitted.
11. A method of manufacturing a display apparatus, the method comprising:

disposing a light-emitting element on a substrate, the light-emitting element emitting light;
    disposing a photodetector on the substrate, the photodetector detecting light;
    disposing a light-blocking layer including a first hole and a second hole, the first hole is disposed above the light-emitting element, and the second hole is disposed above the photodetector;
    disposing a first color filter to cover the first hole;
    disposing a second color filter to cover the second hole; and
    disposing a third color filter, the third color filter overlaps a portion of the second hole, the third color filter reducing a resolution distance of light reaching the photodetector.
12. The method of claim 11, wherein the disposing of the third color filter includes, after the disposing of the second color filter, disposing at least a portion of the third color filter on the second color filter.
13. The method of claim 12, wherein the third color filter is connected to a first surface of the second color filter that faces a direction that the light is emitted.
14. The method of claim 11, wherein the disposing of the light-blocking layer includes, after the disposing of the third color filter, disposing at least a portion of the light-blocking layer on the third color filter.
15. The method of claim 14, wherein the third color filter is connected to a first surface of the light-blocking layer that faces the substrate.
16. The method of claim 11, wherein:
  the disposing of the third color filter includes, after the disposing of the light-blocking layer, disposing the third color filter on the light-blocking layer; and
    the disposing of the second color filter includes, after the disposing of the third color filter, disposing at least a portion of the second color filter on the third color filter.
17. The method of claim 16, wherein the third color filter is connected to a second surface of the light-blocking layer that forms an inner surface of the second hole.
18. The method of claim 16, wherein the third color filter is connected to a third surface of the light-blocking layer that faces a direction that the light is emitted.
19. The method of claim 11, wherein:
  the third color filter is a blue color filter transmitting blue light; and
    the first color filter is a green color filter transmitting green light, or a red color filter transmitting red light.
20. The method of claim 11, wherein the second color filter transmits light of a same color as a color of the first color filter.

* * * * *